US012278158B2

(12) United States Patent
Cheng et al.

(10) Patent No.: US 12,278,158 B2
(45) Date of Patent: *Apr. 15, 2025

(54) LEADFRAME SPACER FOR DOUBLE-SIDED POWER MODULE (71) Applicant: SEMICONDUCTOR COMPONENTS INDUSTRIES, LLC, Scottsdale, AZ (US)

(72) Inventors: Tzu-Hsuan Cheng, Scarborough, ME (US); Yong Liu, Cumberland Foreside, ME (US); Liangbiao Chen, Scarborough, ME (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/520,361

(22) Filed: Nov. 27, 2023

(65) Prior Publication Data

US 2024/0096734 A1 Mar. 21, 2024

Related U.S. Application Data (60) Continuation of application No. 17/447,011, filed on Sep. 7, 2021, now Pat. No. 11,830,784, which is a (Continued)

(51) Int. Cl.
*H01L 23/367* (2006.01)
*H01L 21/52* (2006.01)
(Continued)

(52) U.S. Cl.
CPC .......... *H01L 23/3675* (2013.01); *H01L 21/52* (2013.01); *H01L 21/565* (2013.01);
(Continued)

(58) Field of Classification Search
CPC ... H01L 23/3675; H01L 21/52; H01L 21/565; H01L 23/3735; H01L 23/49575;
(Continued)

(56) References Cited

U.S. PATENT DOCUMENTS 7,019,395 B2  3/2006  Hirano et al.
9,275,926 B2  3/2016  Hable et al.
(Continued)

OTHER PUBLICATIONS

U.S. Appl. No. 17/447,011, filed Sep. 7, 2021, Granted.
U.S. Appl. No. 16/740,130, filed Jan. 10, 2020, Pending.

*Primary Examiner* — Patricia D Valenzuela
(74) *Attorney, Agent, or Firm* — Brake Hughes Bellermann LLP (57) ABSTRACT A semiconductor device module may include a leadframe spacer that provides the functions of both a leadframe and a spacer, while enabling a double-sided cooling configuration. Such a leadframe spacer may include a leadframe surface that provides a die attach pad (DAP) that is shared by at least two semiconductor devices. The leadframe spacer may include at least one downset, where the semiconductor devices may be attached within a recess defined by the at least one downset. A first substrate may be connected to a first side of the leadframe. A second substrate may be connected to downset surfaces of the at least one downset, and positioned for further connection to the semiconductor devices in a double-sided assembly.

20 Claims, 12 Drawing Sheets

Related U.S. Application Data division of application No. 16/740,130, filed on Jan. 10, 2020, now Pat. No. 11,121,055.

(51) Int. Cl.

| | |
|---|---|
| *H01L 21/56* | (2006.01) |
| *H01L 23/00* | (2006.01) |
| *H01L 23/373* | (2006.01) |
| *H01L 23/495* | (2006.01) |
| *H05K 7/20* | (2006.01) |

(52) U.S. Cl.
CPC .... *H01L 23/3735* (2013.01); *H01L 23/49575* (2013.01); *H01L 24/32* (2013.01); *H01L 24/33* (2013.01); *H05K 7/2089* (2013.01); *H01L 23/49524* (2013.01); *H01L 23/49551* (2013.01); *H01L 23/49562* (2013.01); *H01L 24/16* (2013.01); *H01L 24/17* (2013.01); *H01L 2224/32245* (2013.01); *H01L 2224/40245* (2013.01); *H01L 2224/84801* (2013.01); *H01L 2924/13055* (2013.01)

(58) Field of Classification Search
CPC ... H01L 24/32; H01L 24/33; H01L 23/49524; H01L 23/49551; H01L 23/49562; H01L 2224/32245; H01L 2224/40245; H01L 2224/84801; H01L 2924/13055; H01L 24/83; H01L 24/29; H01L 2224/04026; H01L 2224/0603; H01L 2224/291; H01L 2224/29111; H01L 2224/29116; H01L 2224/32225; H01L 2224/3303; H01L 2224/33181; H01L 2224/83815; H01L 2224/8384; H01L 2924/15153; H01L 2924/181; H01L 2924/3512; H01L 2924/35121; H01L 23/049; H01L 23/4334; H01L 23/49531; H01L 25/072; H01L 21/50; H01L 23/49568; H01L 25/50; H01L 23/3736; H01L 21/76224; H01L 23/49827; H01L 21/823475; H01L 25/0657; H01L 27/0886; H01L 2225/06589; H01L 24/17; H01L 24/16; H05K 7/2089

See application file for complete search history.

(56) References Cited

U.S. PATENT DOCUMENTS

| | | |
|---|---|---|
| 9,390,996 B2 | 7/2016 | Jeon |
| 11,121,055 B2* | 9/2021 | Cheng ............... H01L 21/52 |
| 2007/0262346 A1 | 11/2007 | Otremba et al. |
| 2008/0023807 A1* | 1/2008 | Noquil ............ H01L 23/49562 257/E23.101 |
| 2015/0162270 A1* | 6/2015 | Ashrafzadeh ..... H01L 23/49562 257/666 |
| 2019/0221493 A1 | 7/2019 | Chang et al. |

* cited by examiner

LEADFRAME SPACER FOR DOUBLE-SIDED POWER MODULE

RELATED APPLICATIONS

This application is a continuation application of U.S. patent application Ser. No. 17/447,011, filed Sep. 7, 2021, which is a divisional application of U.S. patent application Ser. No. 16/740,130, filed Jan. 10, 2020, which granted on Sep. 14, 2021 as U.S. Pat. No. 11,121,055, both of which are incorporated by reference herein in their entirety.

TECHNICAL FIELD

This description relates to semiconductor packaging techniques for power modules.

BACKGROUND

Semiconductor devices have been developed for use in various applications associated with power supply and power management, such as power converters for variable-speed drives. For example, power modules may use a combination of an Insulated Gate Bipolar Transistor (IGBT) and a diode, such as a Fast Recovery Diode (FRD), for switching applications.

Such semiconductor devices are packaged to enable connections with other circuits, and to deploy the semiconductor devices in a manner that is space-efficient and reliable. Semiconductor devices packaged within a power module, in particular, may have high demands in terms of electrical, mechanical, and thermal reliability.

SUMMARY

According to one general aspect, a semiconductor device module includes a first substrate, and a leadframe spacer having a first side electrically connected to the first substrate and including at least one downset defining a recess that provides a die attach pad (DAP) on a second side of the leadframe spacer that is opposite the first side. The semiconductor device module includes a first semiconductor device disposed within the recess and electrically connected to the DAP, a second semiconductor device disposed within the recess and electrically connected to the DAP, and a second substrate mounted on the second side of the leadframe spacer on at least one downset surface of the at least one downset and at least partially enclosing the first semiconductor device and the second semiconductor device within the recess.

According to another general aspect, a semiconductor device module includes a leadframe spacer having a first side and a second side, the second side having at least one downset with at least one downset surface, a first substrate mounted to the first side of the leadframe spacer, and a second substrate mounted to the at least one downset surface. The semiconductor device module includes a first semiconductor device electrically connected to the second side of the leadframe spacer and to the second substrate, and a second semiconductor device electrically connected to the second side of the leadframe spacer and to the second substrate.

According to another general aspect, a method of manufacturing a semiconductor device module includes mounting a first substrate to a first side of a leadframe spacer, the leadframe spacer including at least one downset defining a recess that provides a die attach pad (DAP) on a second side of the leadframe spacer that is opposite the first side. The method further includes mounting a first semiconductor device and a second semiconductor device onto the DAP, and mounting a second substrate on the second side of the leadframe spacer on at least one downset surface of the at least one downset and at least partially enclosing the first semiconductor device and the second semiconductor device within the recess.

The details of one or more implementations are set forth in the accompanying drawings and the description below. Other features will be apparent from the description and drawings, and from the claims.

DETAILED DESCRIPTION

As referenced above, power module packaging should provide high levels of electrical, mechanical, and thermal reliability, in a cost-efficient and space-efficient manner. In the present description, a leadframe spacer provides the functions of both a leadframe and a spacer of conventional power modules, while also enabling a double-sided cooling configuration.

For example, as described in more detail, below, such a leadframe spacer may include a leadframe surface that provides a die attach pad (DAP) that is shared by (and electrically connected to) at least two semiconductor devices, such as an IGBT and a diode. The leadframe spacer may include at least one downset, which provides one or more downset surfaces and defines a recess, and where the semiconductor devices are attached within the recess.

In this way, a first substrate may be connected to a first side of the leadframe (opposite the semiconductor devices), and a second substrate may be connected to the downset surfaces, and thereby positioned for further connection to the semiconductor devices in a double-sided, dual, or flip chip assembly.

In conventional power modules, separate spacers and leadframes may be used, where a leadframe may be used to provide electrical connections outside of the power module, and the spacers may be used to provide mechanical support and desired positioning for each semiconductor device, relative to a first substrate (e.g., a direct bond copper (DBC) substrate). For example, separate spacers may be used for each of an IGBT and a diode.

Although such designs provide a number of beneficial features, such as good electrical isolation and thermal performance, these and similar designs may suffer from mismatches that may occur in coefficients of thermal expansion (CTE) of different parts of the power module. For example, there may be a CTE mismatch between the conventional spacers and a second DBC substrate of the double-sided power module. There may also be a CTE mismatch between the spacers and surrounding injection molding (e.g., an Epoxy Molding Compound (EMC)). Such CTE mismatches, and associated stresses, may lead to cracking, delamination, or peeling, particularly at solder joints of signal pads of the power module(s).

In contrast, the designs described herein replace conventional, discrete spacers with a single, low-cost leadframe spacer. For example, the leadframe spacer may be made of a single piece of metal that may be easily handled and used during an assembly process.

The described leadframe spacer provides improved mechanical reliability, including reducing (e.g., sharing) an effect of the thermal stress/strain, and reducing peeling (e.g., at solder joints of signal pads). The described leadframe spacer includes a surface within a recess that provides a DAP shared by at least two semiconductor devices, and the shared DAP further provides improved thermal resistance, reduced electrical parasitics, low thermal/electrical resistance, and low electrical inductance, thereby resulting in higher power capability.

The recess is formed by at least one downset, e.g., at least two downsets, which further contribute to the above-referenced reductions in peeling and other negative effects of thermal and mechanical stress/strain. Additionally, the downsets provide downset surfaces such that the leadframe spacer may be electrically and mechanically connected to both substrates of a double-sided power module, and the semiconductor devices enclosed within the recess may easily and reliably be connected to external circuit elements in a desired manner.

Figure 1:
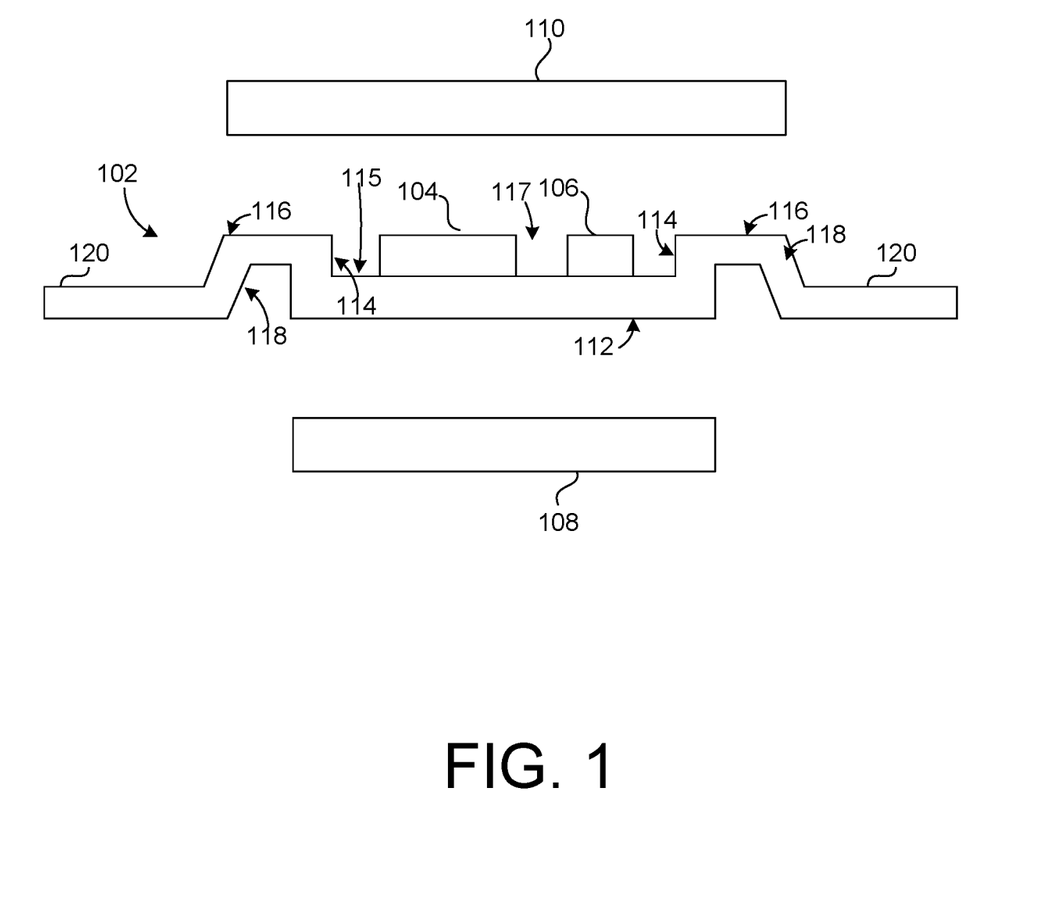
FIG. 1 is a simplified, partially exploded view of a leadframe spacer for a double-sided cooling power module.

FIG. 1 is a simplified, partially exploded view of a leadframe spacer 102 for a double-sided power module. In FIG. 1, the leadframe spacer 102 is used to mount a first semiconductor device 104 (e.g., an IGBT) and a second semiconductor device 106 (e.g., a diode). A first substrate 108 is positioned for mounting to a first side of the leadframe spacer 102, and a second substrate 110 is positioned for mounting to a second, opposing side of the leadframe spacer 102.

In more detail, the first substrate 108 is positioned for mounting to a planar surface 112 of the leadframe spacer 102, on a first side of the leadframe spacer 102. The leadframe spacer 102 includes at least two downsets 114, which define a Die Attach Pad (DAP) surface 115, on which the semiconductor devices 104, 106 may be mounted.

The leadframe 102 includes downset surfaces 116, so that a recess 117 is formed between the downset surfaces 116 and the DAP 115. As illustrated and described in more detail, below, the second substrate 110 may thus be mounted to the downset surfaces 116, in a plane that enables desired connections of the second substrate 110 to the semiconductor devices 104, 106.

Example downset(s) 114 may include any portion of the leadframe spacer 102 that define a spatial offset between the DAP surface 115 and the downset surfaces 116 that is sufficient to position the semiconductor devices 104, 106 on the DAP surface 115, while mounting the second substrate 110 using the downset surfaces 116. Put another way, the downset(s) 114 define a displacement in a direction perpendicular to the DAP surface 115. The downset(s) 114 may be perpendicular to the DAP surface 115, or may be angled relative to the DAP surface 115, or combinations thereof. As illustrated in more detail, below, e.g., in the examples of FIGS. 8-15, the downset(s) 114 may extend at least partially around a perimeter or other portion of the leadframe spacer 102.

In the example of FIG. 1, the downset surfaces 116 may extend in a direction parallel to the DAP surface 115, and perpendicular to the downsets 114. An angled portion 118 may be connected to the downset surface 116 and to a lead 120, to thereby provide additional force absorption and mechanical strain relief.

In various implementations, as referenced, the downsets 114 may be angled relative to the DAP surface 115, as long as a depth of the recess 117 is sufficient to include the semiconductor devices 104, 106 within the recess 117. Accordingly, the semiconductor devices 104, 106 may be at least partially enclosed within the recess 117 by the attaching of the second substrate 110 to the downset surfaces 116.

Figure 2:
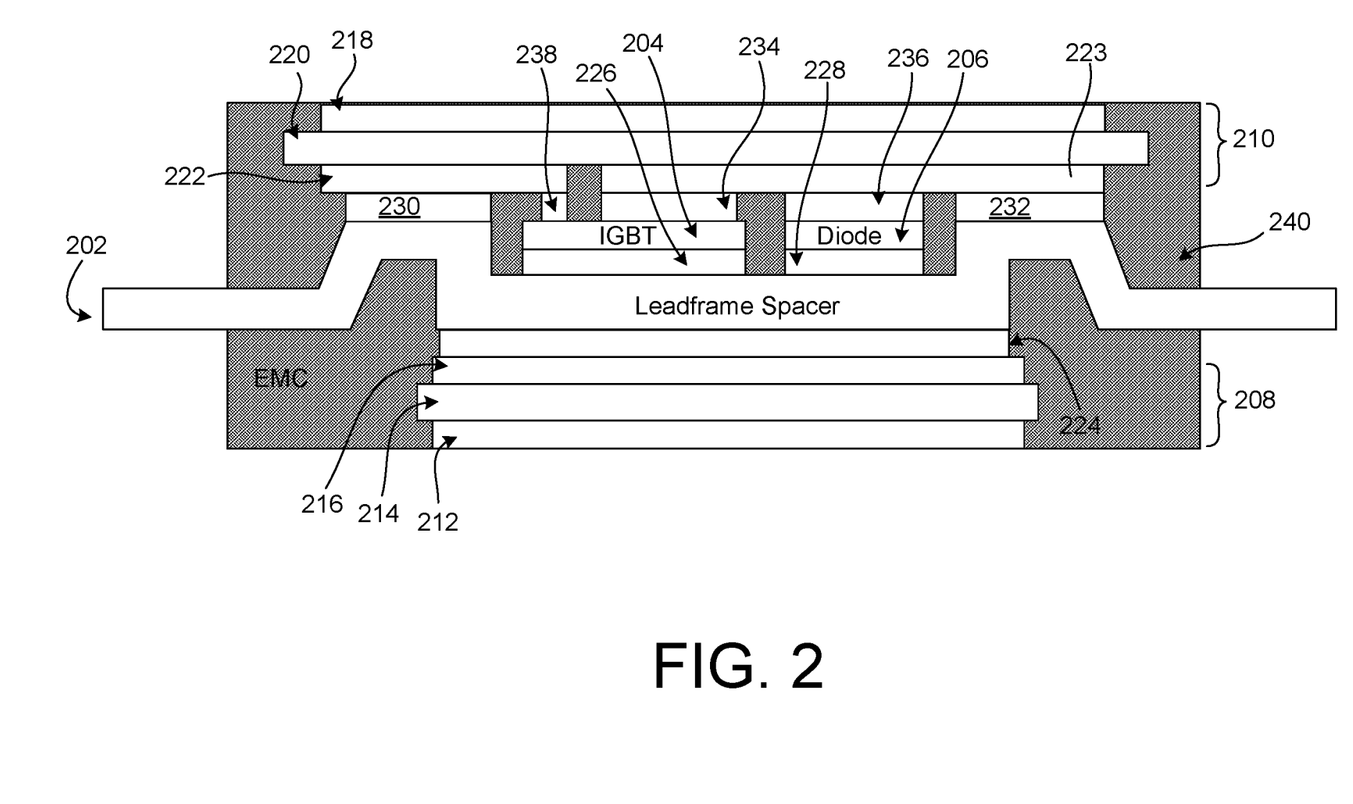
FIG. 2 is a cross-section of an example implementation of a double-sided cooling power module using the leadframe spacer of FIG. 1.

FIG. 2 is a cross-section of an example implementation of a double-sided power module using the leadframe spacer of FIG. 1. FIG. 2 illustrates an assembled version of FIG. 1, including more specific example implementation details, including solder connections.

In FIG. 2, a leadframe spacer 202 is used to mount IGBT 204 and diode 206, within a downset-defined recess of the leadframe spacer 202, and otherwise in the manner described above with respect to FIG. 1. Also as in FIG. 1, a first substrate 208 is mounted to a first side of the leadframe spacer 202 (opposite the IGBT 204 and the diode 206). A second substrate 210 is mounted on the second, opposing (device-side) side of the leadframe spacer 202, using downset surfaces of the leadframe spacer 202.

In FIG. 2, the first substrate 208 is a DBC substrate that includes a first copper layer 212, a dielectric layer 214 (e.g., a ceramic layer, such as $Al_2O_3$), and a second copper layer 216. Similarly, the second substrate 210 is a DBC substrate that includes a first copper layer 218, a dielectric layer 220 (e.g., a ceramic layer, such as $Al_2O_3$), and a second copper layer 222/223 that includes a first portion 222, and a second portion 223, as illustrated and as described in more detail, below.

Solder connections are illustrated in FIG. 2, including a solder layer 224 connecting the first substrate 208 to the leadframe spacer 202, a solder layer 226 connecting the IGBT 204 to the leadframe spacer 202, and a solder layer 228 connecting the diode 206 to the leadframe spacer 202.

Similarly, the second substrate 210 has the portion 222 connected by solder layer 230 to a downset surface of the leadframe spacer 202, and the portion 223 connected by solder layer 232 to a downset surface of the leadframe spacer 202. The portion 223 is further connected by solder layer 234 to the IGBT 204, and by solder layer 236 to the diode 206. The portion 222 is further connected by solder layer 238 to the IGBT (e.g., to a gate of the IGBT).

Finally in FIG. 2, molding 240 may be provided. For example, EMC or other suitable encapsulate such as other epoxy molding compound(s) may be used.

FIGS. 3-6 are cross-sections of an example process for forming the example implementation of FIG. 2. FIG. 7 is a flowchart illustrating example process steps corresponding to the examples of FIGS. 3-6.

Figure 3:
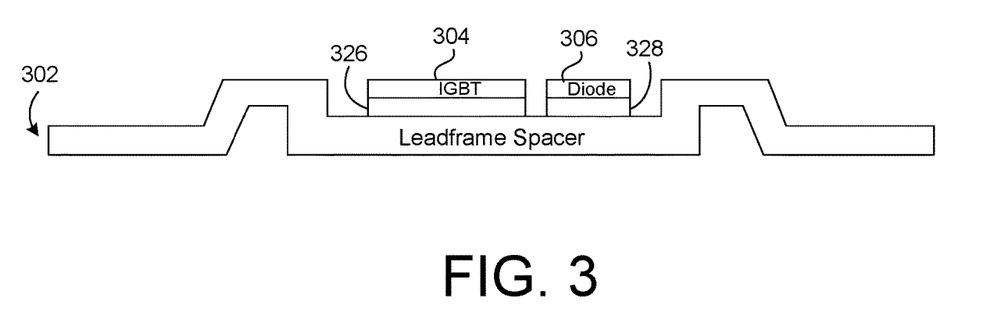
FIG. 3 is a cross-section of a first example process step for forming the example implementation of FIG. 2.

In FIG. 3, a leadframe spacer 302 is provided that corresponds to the leadframe spacers 102, 202 of FIGS. 1 and 2. IGBT 304 and diode 306 may be mounted to the DAP of the leadframe spacer 302 using solder layers 326 and 328, respectively.

More specifically, as referenced in FIG. 7, the IGBT 304 and diode 306 may be attached to the leadframe spacer 302 using solder 326, 328 with a high melting temperature (702). For example, due to the relatively large surface area of the DAP of the leadframe spacer 302, silver sintering may be performed using $Pb_8Sn_2Ag$, at a temperature of 300 C or higher.

Figure 4:
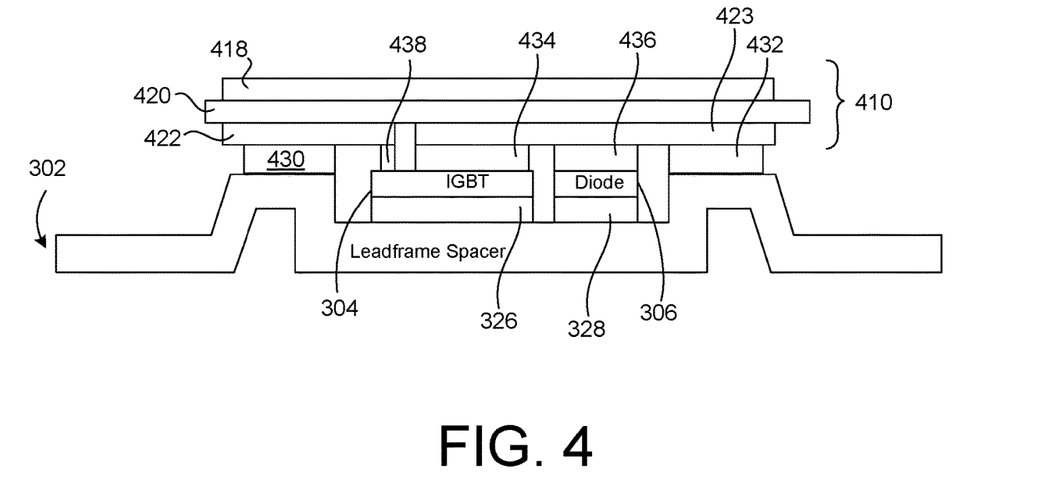
FIG. 4 is a cross-section of a second example process step for forming the example implementation of FIG. 2.

In FIG. 4, a device-side substrate 410 may be attached that includes a copper layer 418, a dielectric layer 420, and a copper layer with portions 422, 423. Similar to the illustration of FIG. 2, solder layers 430, 432 may be used to attach the portions 422, 423, respectively, to downset surfaces of the leadframe spacer 302. Solder layers 434 and 436 may connect the IGBT 304 and the diode 306, respectively, to the substrate portion 423, while solder layer 438 connects the copper substrate portion 422 to the IGBT gate.

As shown in FIG. 7, the device-side substrate 410 may be attached to the leadframe spacer 302 and devices 304, 306, using a medium temperature solder (704). For example, $SnSb_5$ may be used, at temperatures in the range of about 240-260 C.

Figure 5:
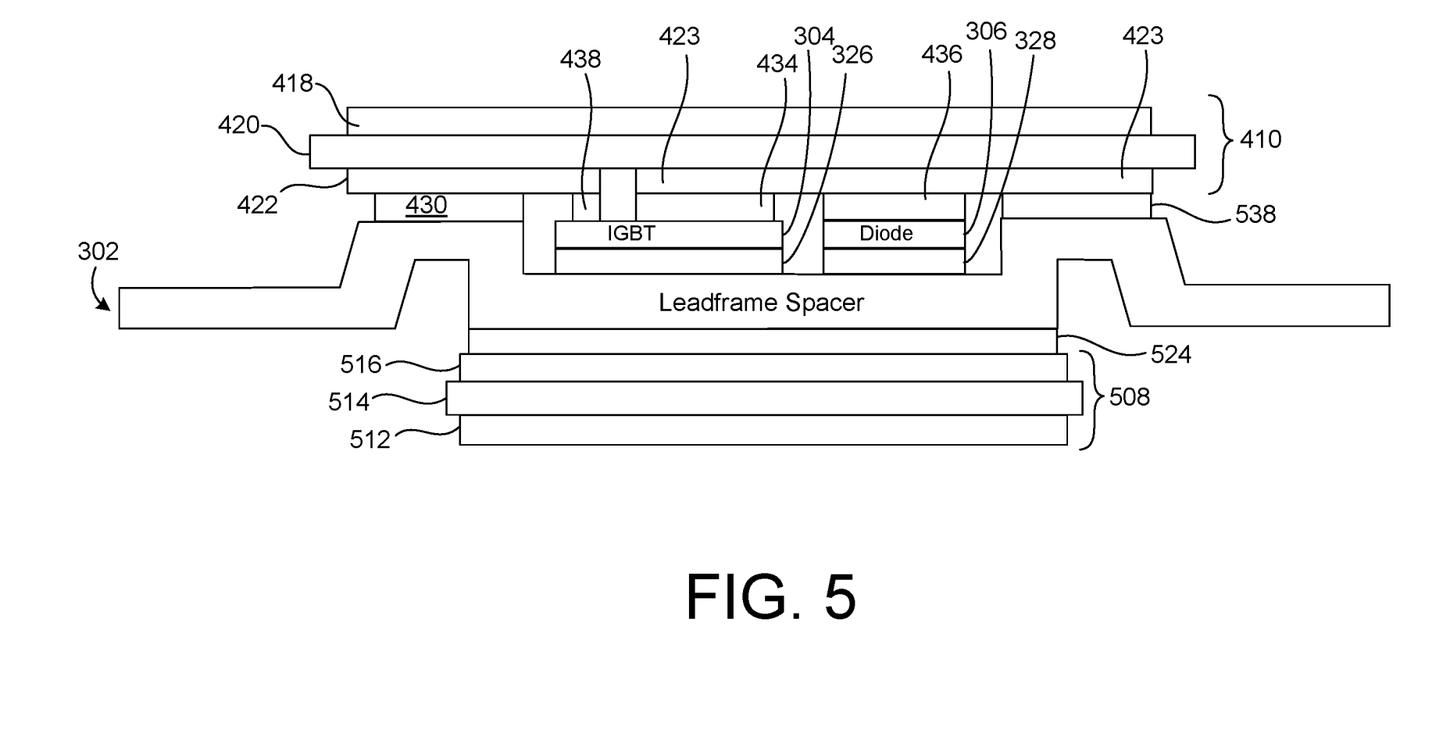
FIG. 5 is a cross-section of a third example process step for forming the example implementation of FIG. 2.

As shown in FIG. 5, a substrate 508 may be mounted to the leadframe spacer 302 on a side thereof that is opposite the device-side. The substrate 508 may include copper layer 512, dielectric layer 514, and copper layer 516, and may be mounted using solder layer 524.

As shown in FIG. 7, the substrate 508 may be mounted using solder layer 524 in a low melting temperature mounting process (706). For example, $Sn_{3.5}Ag_{0.5}Cu$ may be used, at temperatures in a range of about 200-220 C. Using the different solder melting temperature ranges as described, or similar, for performing multiple solder operations, results in reliable electrical connections at each process step, without negatively impacting electrical connections made in preceding process steps.

Figure 6:
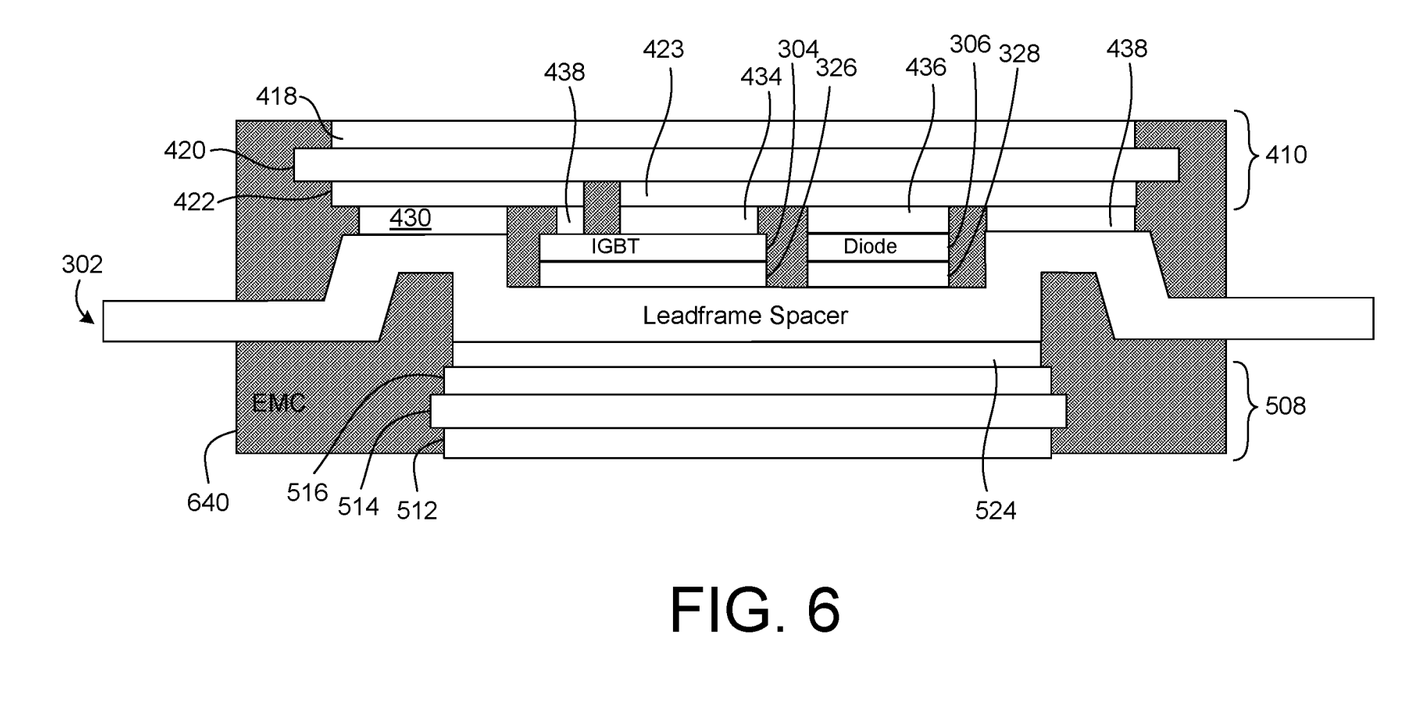
FIG. 6 is a cross-section of a fourth example process step for forming the example implementation of FIG. 2.
Figure 7:
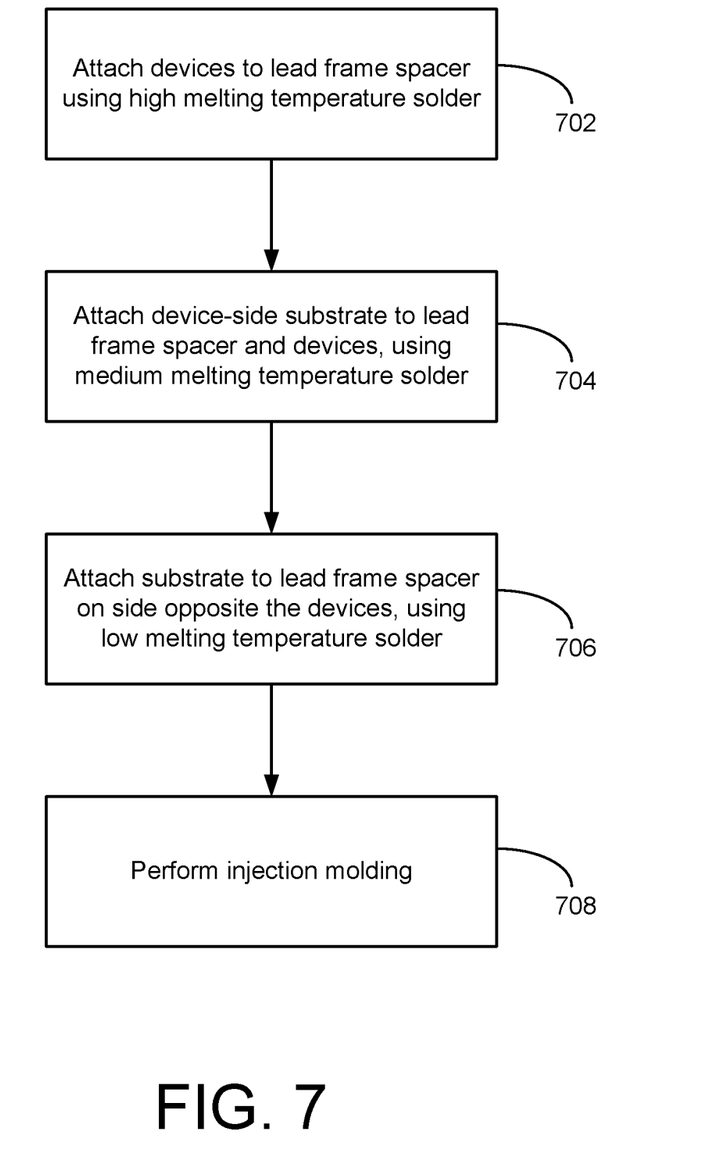
FIG. 7 is a flowchart illustrating example process steps corresponding to the examples of FIGS. 3-6.

FIG. 6 illustrates the addition of injection molding 640 (708). As may be observed, mismatches in coefficients of thermal expansion (CTE) between the molding 640 and discrete spacers, as occurs in conventional systems, is reduced. For example, an area of interface between at which such CTE mismatch may occur may be reduced.

Figure 8:
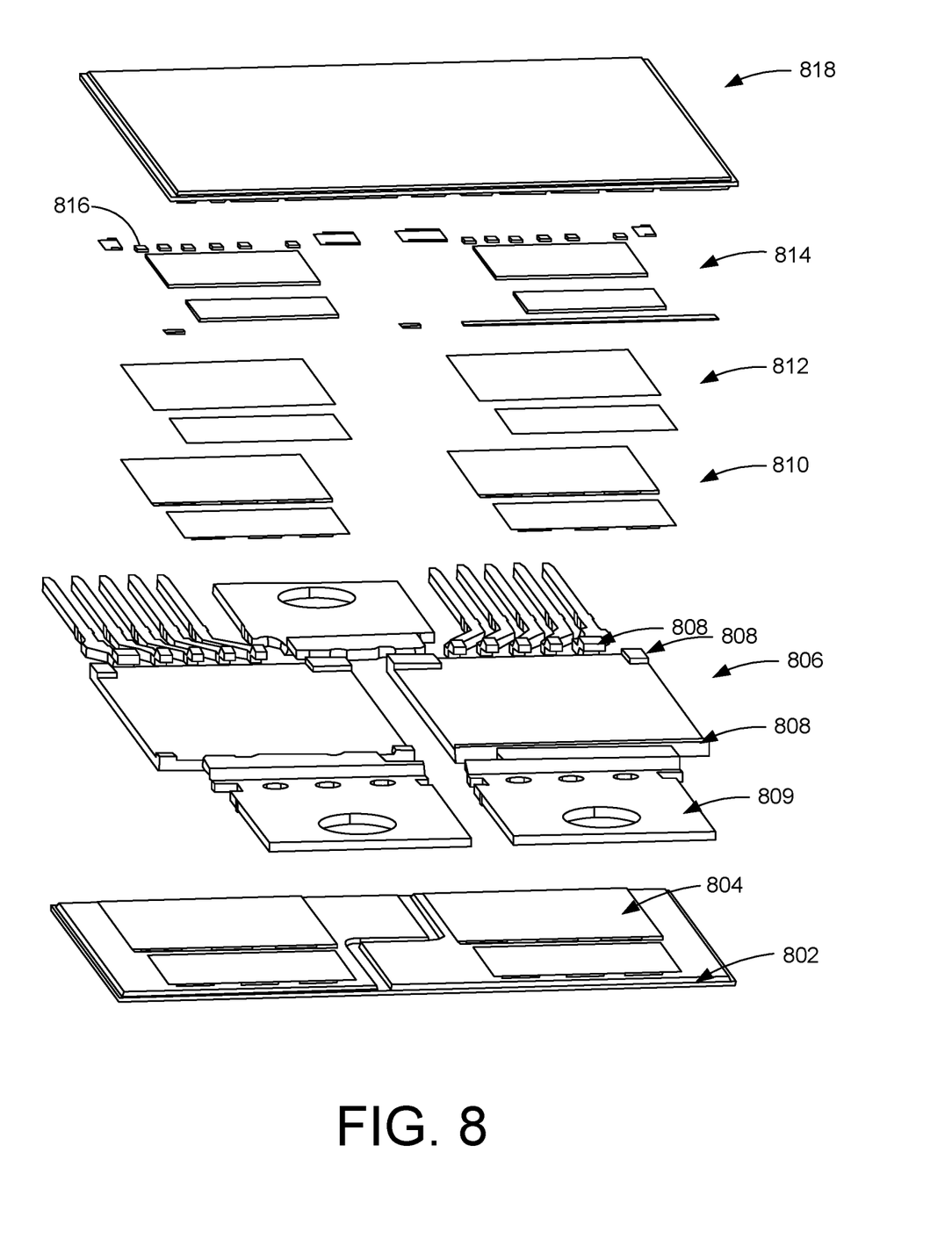
FIG. 8 is an exploded view of a more detailed example implementation of a double-sided power module with a leadframe spacer, corresponding to the example of FIG. 1.

FIG. 8 is an exploded view of a more detailed example implementation of a double-sided power module with a leadframe spacer, corresponding to the example of FIG. 1. In FIG. 8, a first substrate 802 has solder pads 804 provided thereon.

Figure 9:
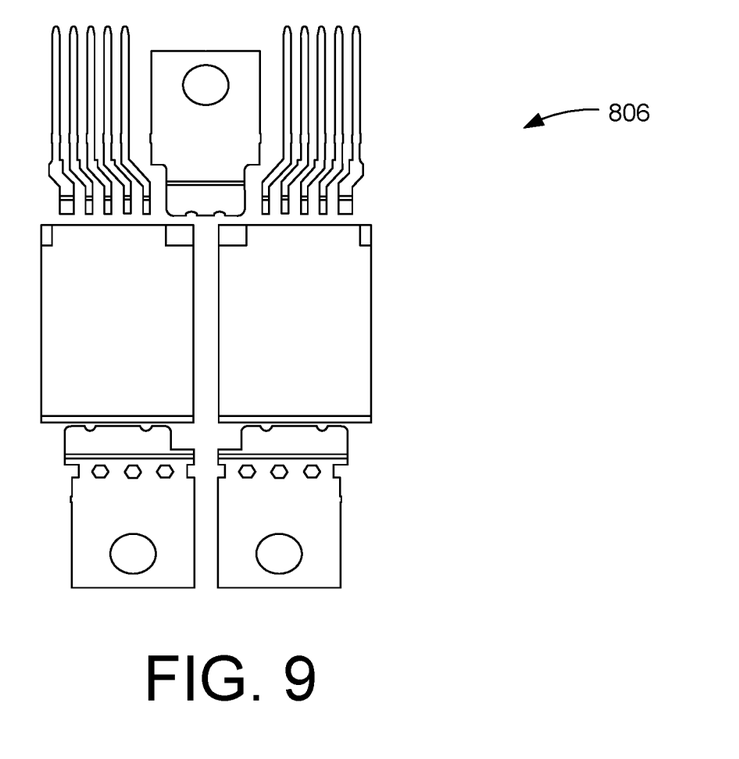
FIG. 9 is a top view of the leadframe spacer of FIG. 8.
Figure 10:
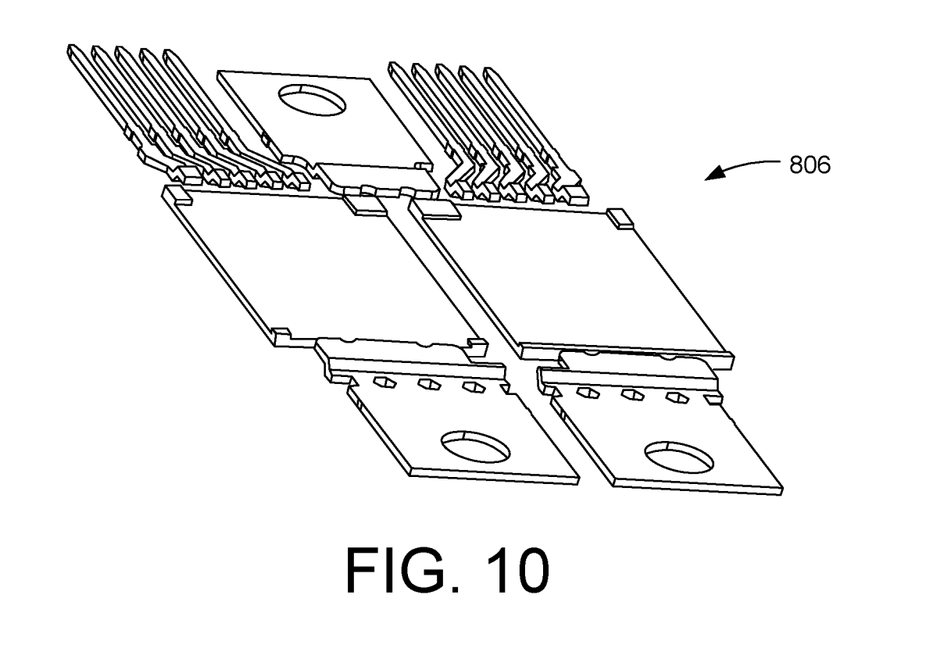
FIG. 10 is a side-angle view of the leadframe spacer of FIG. 8.

A leadframe spacer 806 illustrates an example implementation of the leadframe spacers 102, 202, 302, described above. FIG. 9 is a top view of the leadframe spacer of FIG. 8, and FIG. 10 is a side-angle view of the leadframe spacer of FIG. 8.

In FIG. 8, the leadframe spacer 806 may include downsets 808 and corresponding peeling downset surfaces. As shown, the downsets 808 may be implemented in multiple configurations, as long as the leadframe 806 ultimately has a recess in which a DAP is included to receive solder layers 810 and semiconductor dies (devices) 812. The leadframe 806 also may contain connectors 809 (e.g., power/ground/gate connectors) and other features used, e.g., to mount the final module in a desired fashion.

Further in FIG. 8, solder layer 814 is illustrated, including signal pad solder joints 816. As described herein, and illustrated in more detail below with respect to FIGS. 13-15, signal pad connections may correspond to an electrical connection to a gate of an IGBT mounted on the leadframe 806. Due to having a relatively small size, such signal pads are conventionally known to provide a point of mechanical or electrical failure. However, as illustrated and described herein, the leadframe spacer 806 enables reliable formation and use of the signal pad solder joints 816.

Figure 11:
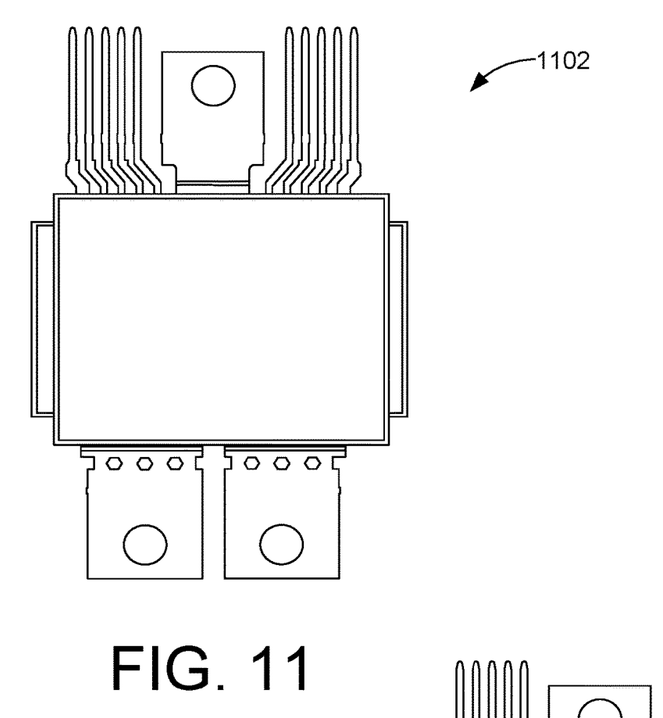
FIG. 11 is a top view of an assembled version of the example of FIG. 8, prior to molding.
Figure 12:
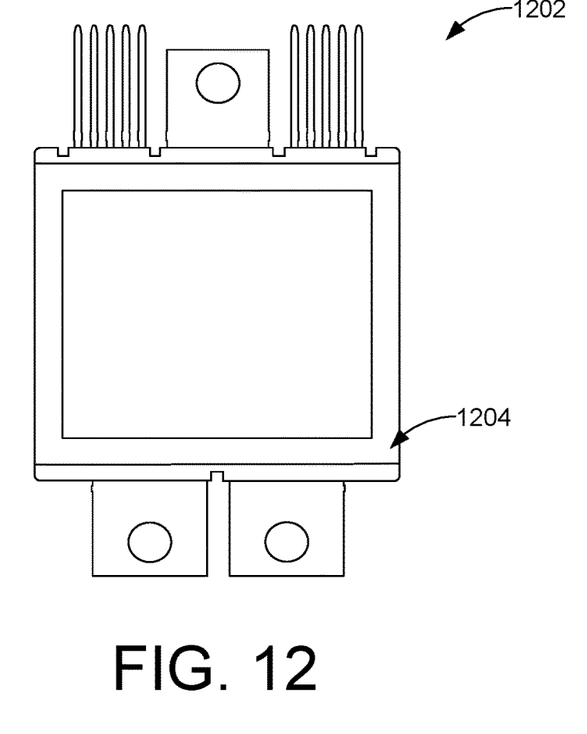
FIG. 12 is a top view of an assembled version of the example of FIG. 8, with molding completed.

Finally in FIG. 8, a second substrate 818 is illustrated. When assembled, the result is illustrated in FIG. 11 as a top view 1102, prior to molding. FIG. 12 is a top view of an assembled version 1202 of the example of FIG. 8, with molding 1204 completed.

Figure 13:
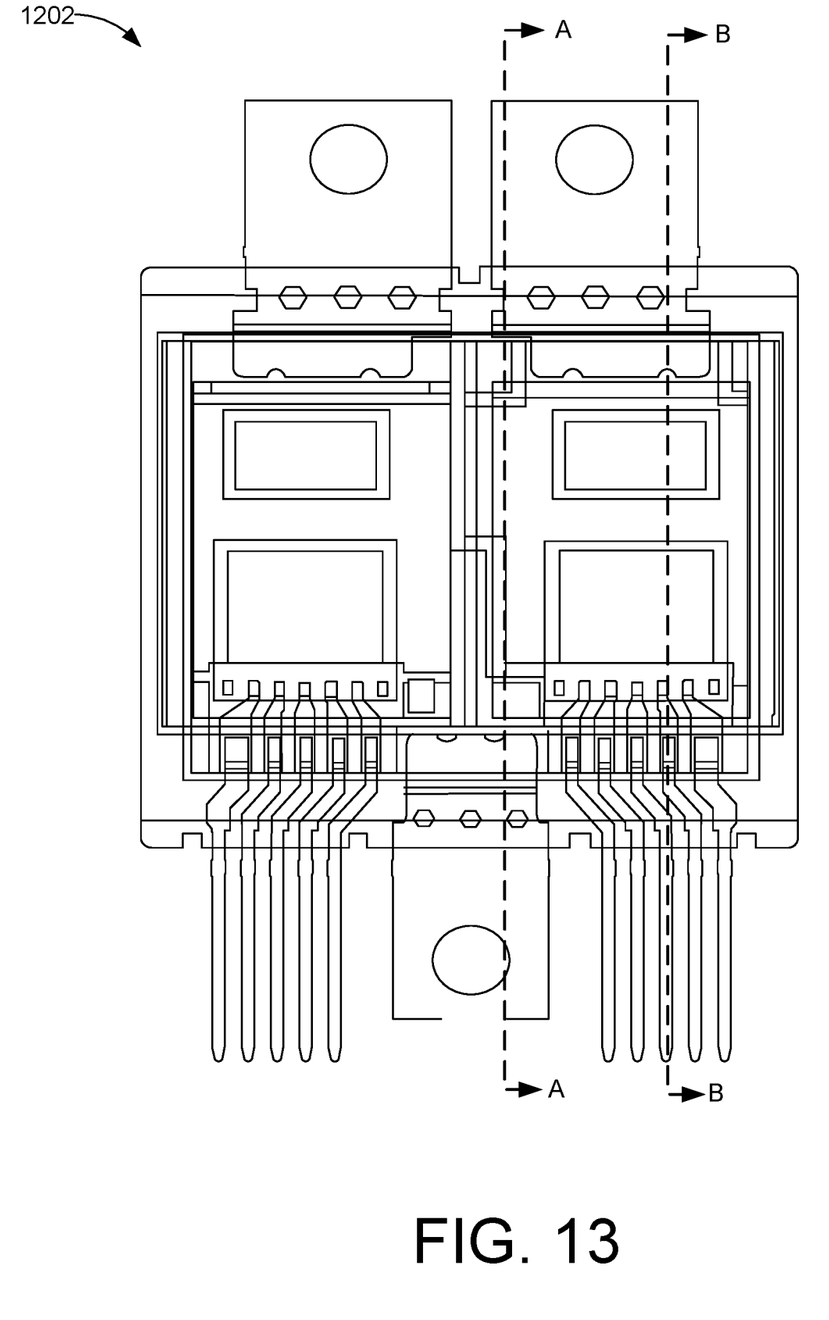
FIG. 13 is a transparent top view of the example of FIG. 12.
Figure 14:
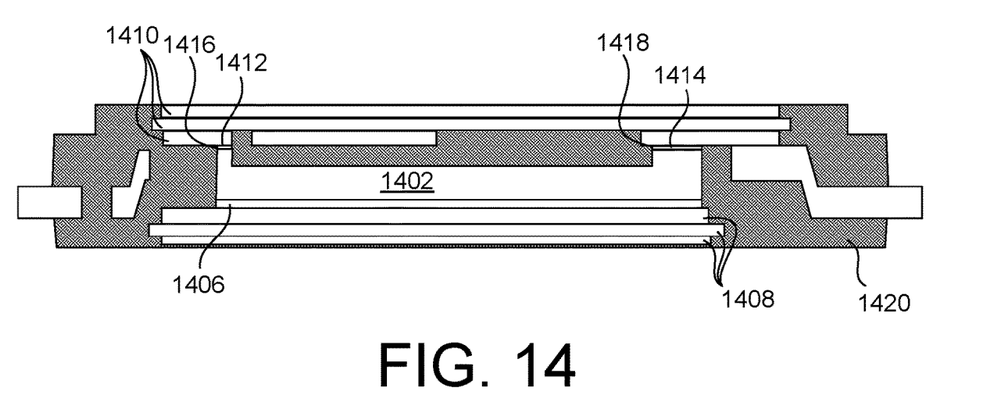
FIG. 14 is a cross-section of FIG. 13 taken at line A-A.
Figure 15:
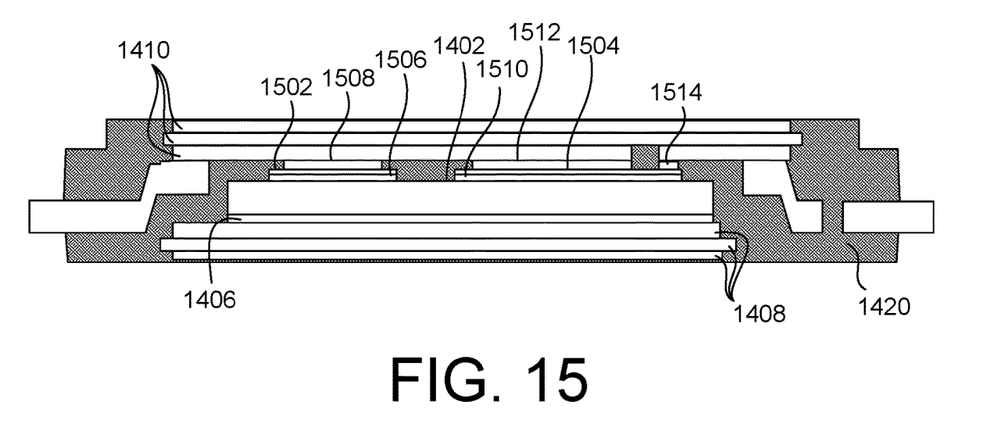
FIG. 15 is a cross-section of FIG. 13 taken at line B-B.

FIG. 13 is a transparent top view of the example of FIG. 12, with FIG. 14 being a cross-section of FIG. 13 taken at line A-A, and FIG. 15 being a cross-section of FIG. 13 taken at line B-B.

As shown in FIG. 14, a leadframe spacer 1402 has a first side attached by solder 1406 to a substrate 1408. A substrate 1410 is attached by solder 1412 and 1414 to the second, opposing side of the leadframe spacer 1402. Specifically, the substrate 1410 is attached to downsets 1412 and 1414 of the leadframe spacer 1402, using solder connections 1416 and 1418, respectively. The assembly is encapsulated in molding 1420.

As shown in FIG. 15, semiconductor device 1502 (e.g., a diode) may be connected by solder 1506 to the leadframe spacer 1402, and by solder 1508 to the substrate 1410. A semiconductor device 1504 (e.g., an IGBT) may be connected by solder 1510 to the leadframe spacer 1402, and by solder 1512 to the substrate 1410. Solder 1514 corresponds to an example of the signal pad solder joint 816 of FIG. 8.

Figure 16:
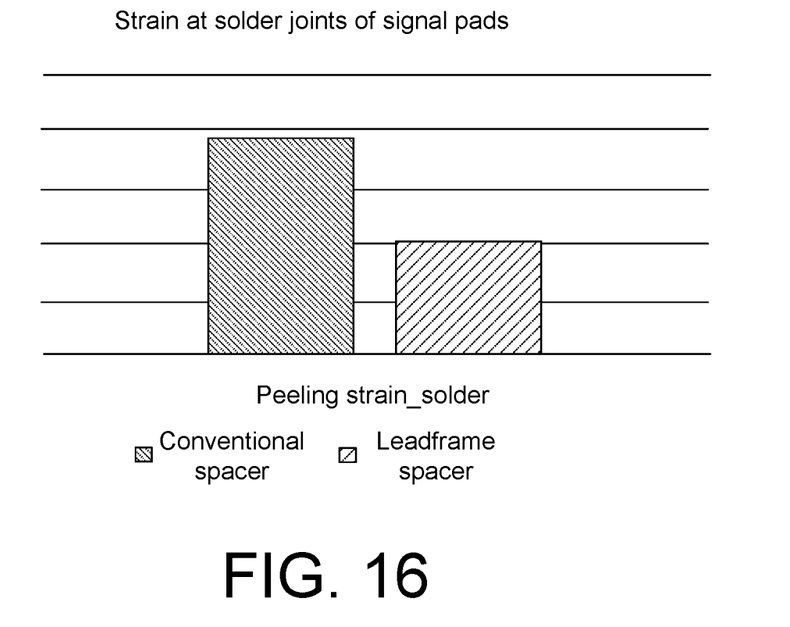
FIG. 16 is a graph illustrating peeling strain levels at solder joints of signal pads, in example embodiments.

In more detail regarding the solder 1514, FIG. 16 is a graph illustrating peeling strain levels at solder joints of signal pads, in example embodiments. As shown, strain levels at solder joints of signal pads may be substantially reduced, e.g., by a factor of two or more, as compared to example conventional designs.

Figure 17:
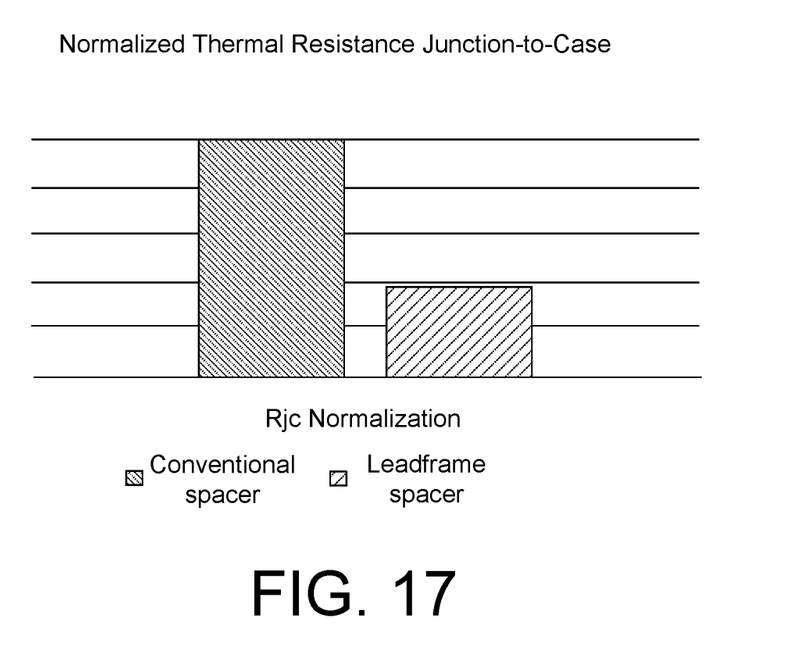
FIG. 17 is a graph illustrating thermal resistance levels, in example embodiments.

FIG. 17 is a graph illustrating thermal resistance levels, in example embodiments. FIG. 17 illustrates junction-to-case thermal resistance, and again illustrates a substantial reduction obtained using the example techniques described herein, as compared to conventional examples.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device module, comprising:
a first substrate;
a leadframe spacer having a first side electrically connected to the first substrate and including at least two pedestals on a second side of the leadframe spacer that is opposite the first side;
a first semiconductor device disposed on the second side of, and electrically connected to, the leadframe spacer;
a second semiconductor device disposed on the second side of, and electrically connected to, the leadframe spacer; and
a second substrate mounted on the second side of the leadframe spacer on the at least two pedestals and at least partially enclosing the first semiconductor device and the second semiconductor device.

2. The semiconductor device module of claim 1, wherein the at least two pedestals extend partially around a perimeter of the leadframe spacer.

3. The semiconductor device module of claim 1, wherein the leadframe spacer has a rectangular shape, and the at least two pedestals include at least four pedestals at corners of the leadframe spacer.

4. The semiconductor device module of claim 1, further comprising molding that at least partially encapsulates the leadframe spacer, the first substrate, and the second substrate, with a surface of the first substrate opposite the leadframe spacer and a surface of the second substrate opposite the leadframe spacer being exposed and not encapsulated by the molding.

5. The semiconductor device module of claim 1, further comprising:
a lead having a lead surface that is coplanar with the at least two pedestals and attached to the first substrate, and thereby to at least one of the first semiconductor device and the second semiconductor device.

6. The semiconductor device module of claim 1, wherein:
the at least two pedestals define a recess that provides a die attach pad (DAP);
the first semiconductor device is disposed within the recess and electrically connected to the DAP; and
the second semiconductor device is disposed within the recess and electrically connected to the DAP.

7. The semiconductor device module of claim 1, wherein the second substrate has a first portion connected to the first semiconductor device, and a second portion connected to both of the first semiconductor device and the second semiconductor device.

8. The semiconductor device module of claim 7, wherein the first portion has a solder connection to a signal pad of the semiconductor device module.

9. The semiconductor device module of claim 1, wherein the first substrate and the second substrate are direct bond copper (DBC) substrates.

10. The semiconductor device module of claim 1, wherein the leadframe spacer comprises copper, the first semiconductor device includes an insulated gate bipolar transistor (IGBT), and the second semiconductor device includes a diode.

11. A semiconductor device module, comprising:
a leadframe spacer having a first side and a second side, the second side having at least two pedestals;
a first substrate mounted to the first side of the leadframe spacer;
a second substrate mounted to the at least two pedestals;
a first semiconductor device electrically connected to the second side of the leadframe spacer and to the second substrate; and
a second semiconductor device electrically connected to the second side of the leadframe spacer and to the second substrate.

12. The semiconductor device module of claim 11, wherein the at least two pedestals extend partially around a perimeter of the leadframe spacer.

13. The semiconductor device module of claim 11, wherein the leadframe spacer has a rectangular shape, and the at least two pedestals include at least four pedestals at corners of the leadframe spacer.

14. The semiconductor device module of claim 11, further comprising molding that at least partially encapsulates the leadframe spacer, the first substrate, and the second substrate, with a surface of the first substrate opposite the leadframe spacer and a surface of the second substrate opposite the leadframe spacer being exposed and not encapsulated by the molding.

15. The semiconductor device module of claim 11, further comprising:
a lead having a lead surface that is coplanar with the at least two pedestals and attached to the first substrate, and thereby to at least one of the first semiconductor device and the second semiconductor device.

16. The semiconductor device module of claim 11, wherein the at least two pedestals define a recess, and the first semiconductor device and the second semiconductor device are mounted within the recess and at least partially enclosed by the second substrate.

17. The semiconductor device module of claim 11, wherein the first semiconductor device has at least one solder connection to the first substrate and to the second substrate, and the second semiconductor device has at least one solder connection to the first substrate and to the second substrate.

18. A semiconductor device module, comprising:
   a leadframe spacer having a first side and a second side, the second side having at least two pedestals;
   a first substrate mounted to the first side of the leadframe spacer;
   a second substrate mounted to the at least two pedestals;
   a first semiconductor device electrically connected to the second side of the leadframe spacer and to the second substrate;
   a second semiconductor device electrically connected to the second side of the leadframe spacer and to the second substrate; and
   a plurality of leads connected to the second substrate and coplanar with pedestal surfaces of the at least two pedestals.

19. The semiconductor device module of claim 18, further comprising molding that at least partially encapsulates the leadframe spacer, the first substrate, and the second substrate, with a surface of the first substrate opposite the leadframe spacer and a surface of the second substrate opposite the leadframe spacer being exposed and not encapsulated by the molding.

20. The semiconductor device module of claim 18, wherein the leadframe spacer has a rectangular shape, and the at least two pedestals include at least four pedestals at corners of the leadframe spacer.

* * * * *